(12) United States Patent
Wu et al.

(10) Patent No.: US 12,262,568 B1
(45) Date of Patent: Mar. 25, 2025

(54) METHOD AND MOLD FOR MANUFACTURING LED LIGHT STRIP, AND LED LIGHT STRIP

(71) Applicant: Signcomplex Limited, Shenzhen (CN)

(72) Inventors: Tiejun Wu, Shenzhen (CN); Hailong Zhu, Shenzhen (CN); Ji'an Wei, Shenzhen (CN); Wenhai Liu, Shenzhen (CN); Wenmao Wei, Shenzhen (CN); Yongbo Zhu, Shenzhen (CN)

( * ) Notice: Subject to any disclaimer, the term of this patent is extended or adjusted under 35 U.S.C. 154(b) by 0 days.

(21) Appl. No.: 18/787,948

(22) Filed: Jul. 29, 2024

Related U.S. Application Data

(63) Continuation-in-part of application No. 18/401,562, filed on Dec. 31, 2023, now Pat. No. 12,123,585.

(51) Int. Cl.
| | |
|---|---|
| *H10H 20/856* | (2025.01) |
| *B29C 64/112* | (2017.01) |
| *B29C 64/124* | (2017.01) |
| *H01L 25/075* | (2006.01) |
| *H10H 20/01* | (2025.01) |

(52) U.S. Cl.
CPC ......... *H10H 20/856* (2025.01); *B29C 64/112* (2017.08); *B29C 64/124* (2017.08); *H01L 25/0753* (2013.01); *H10H 20/0363* (2025.01)

(58) Field of Classification Search
CPC . B29C 64/124; B29C 64/112; H01L 25/0753; H01L 33/60
See application file for complete search history.

(56) References Cited

U.S. PATENT DOCUMENTS

| | | | |
|---|---|---|---|
| 2015/0145406 A1* | 5/2015 | Li | F21K 9/232 |
| | | | 264/1.7 |
| 2019/0056077 A1* | 2/2019 | Li | H05K 1/189 |
| 2020/0025343 A1* | 1/2020 | Labas | F21S 4/22 |
| 2020/0238601 A1* | 7/2020 | Pachaly | B29C 64/112 |

* cited by examiner

*Primary Examiner* — Evan P Dzierzynski
*Assistant Examiner* — Nathaniel J Lee

(57) ABSTRACT

In the present disclosure, a light-blocking compound is simultaneously dripped into light-blocking compound setting grooves located on a left side and a right side of a light bead by using a compound dripping machine, so as to form two light-blocking dam colloids respectively disposed on the left side and the right side of the light bead on a compound-dripped surface of a light panel. After the light-blocking dam colloids are cured, a diffusion compound is dripped into a diffusion compound setting groove by using the compound dripping machine, so as to form a diffusion colloid on the two light-blocking dam colloids.

14 Claims, 9 Drawing Sheets

Place a light panel with a light bead on a compound dripping station of a compound dripping machine

Simultaneously drip a light-blocking compound in light-blocking compound setting grooves on a left side and a right side of the light bead by using the compound dripping machine

Drip a diffusion compound in a diffusion compound setting groove by using the compound dripping machine to form a diffusion colloid on two light-blocking dam colloids

Figure 1

METHOD AND MOLD FOR MANUFACTURING LED LIGHT STRIP, AND LED LIGHT STRIP

TECHNICAL FIELD

The present disclosure relates to the technical field of LED light strips, and in particular to a method and mold for manufacturing an LED light strip, and an LED light strip.

BACKGROUND ART

LED light strips have a wide range of applications in the market, such as furniture, cabinets, home decoration, commercial place exhibition, vehicle decoration, and toy decoration, and also play an irreplaceable role in courtyards and stage performances.

SUMMARY

Embodiments of the present disclosure provide a method and mold for manufacturing an LED light strip, and an LED light strip, which solve the problems present in related art. The technical solutions are provided as follows.

In a first aspect, an embodiment of the present disclosure provides a method for manufacturing an LED light strip, the method including:

a feeding step, during which a light panel with a light bead is placed on a compound dripping station of a compound dripping machine in such a way that a compound-dripped surface of the light panel with the light bead faces a bottom opening of each of light-blocking compound setting grooves of a light-blocking compound setting mold, and a left light-blocking compound setting groove and a right light-blocking compound setting groove of the light-blocking compound setting mold are respectively disposed on a left side and a right side of the light bead;

a light-blocking compound dripping step, during which a light-blocking compound is simultaneously dripped into the light-blocking compound setting grooves located on the left side and the right side of the light bead by using the compound dripping machine, so as to form two light-blocking dam colloids respectively disposed on the left side and the right side of the light bead on the compound-dripped surface of the light panel; and a diffusion compound dripping step, during which after the light-blocking dam colloids are cured such that the light-blocking dam colloids face a bottom opening of a diffusion compound setting groove of a diffusion compound setting mold, a diffusion compound is dripped into the diffusion compound setting groove by using the compound dripping machine, so as to form a diffusion colloid on the two light-blocking dam colloids respectively disposed on the left side and the right side of the light bead.

In an implementation, the method further includes:

a light-blocking compound stirring step, during which before the light-blocking compound is dripped, the light-blocking compound is vacuumized and stirred by using a vacuum agitator, so as to remove bubbles in the light-blocking compound.

In an implementation, the method further includes:

a diffusion compound stirring step, during which before the diffusion compound is dripped, the diffusion compound is vacuumized and stirred by using a vacuum agitator, so as to remove bubbles in the diffusion compound.

In an implementation, in the light-blocking compound dripping step, a conveyor belt in the compound dripping machine is used to convey the light panel in such a way that the light panel passes through the compound dripping station.

In an implementation, in the light-blocking compound dripping step, a conveyor belt is used to transfer a compound-dripped part of the light panel from the compound dripping station to a drying station, and then an oven is used to dry the light-blocking dam colloids located at the drying station.

In an implementation, in the diffusion compound dripping step, a conveyor belt in the compound dripping machine is used to convey the light panel in such a way that the light panel passes through the compound dripping station.

In an implementation, in the diffusion compound dripping step, an oven of the compound dripping machine is used to dry the diffusion colloid while the compound is dripped, so as to dry the compound while the compound is dripped.

In a second aspect, an embodiment of the present disclosure provide a mold for manufacturing an LED light strip, the mold including:

a light-blocking compound setting mold, wherein the light-blocking compound setting mold is provided with a light-blocking compound mold head, the light-blocking compound mold head has a light-blocking compound inlet channel, light-blocking compound setting grooves and an avoidance groove, an upper end of the light-blocking compound inlet channel is configured for communication with a compound outlet of a compound dripping machine, a lower end of the light-blocking compound inlet channel extends to a wall of each of the light-blocking compound setting grooves, the lower end of the light-blocking compound inlet channel is in communication with the light-blocking compound setting grooves, the light-blocking compound setting grooves run through the light-blocking compound mold head in a front-rear direction, the light-blocking compound setting grooves further run through a bottom wall of the light-blocking compound mold head, two light-blocking compound setting grooves are provided, the two light-blocking compound setting grooves are respectively arranged on a left side and a right side of the avoidance groove, the avoidance groove runs through the light-blocking compound mold head in a front-rear direction, the avoidance groove further runs through the bottom wall of the light-blocking compound mold head, and the avoidance groove is configured to be in clearance fit with a light bead of a light panel, so as to avoid the light bead; and a diffusion compound setting mold, wherein the diffusion compound setting mold is provided with a diffusion compound mold head, the diffusion compound mold head has a diffusion compound inlet channel and a diffusion compound setting groove, an upper end of the diffusion compound inlet channel is configured for communication with the compound outlet of the compound dripping machine, a lower end of the diffusion compound inlet channel extends to a wall of the diffusion compound setting groove, the lower end of the diffusion compound inlet channel is in communication with the diffusion compound setting groove, the diffusion compound setting groove runs through the diffusion compound mold head in a front-rear direction, and the diffusion compound setting groove further runs through a bottom wall of the diffusion compound mold head.

In an implementation, the light-blocking compound inlet channel is vertically arranged on the light-blocking compound mold head, and the lower end of the light-blocking compound inlet channel extends to top walls of the light-blocking compound setting grooves.

In an implementation, a plurality of light-blocking compound mold heads are provided, each light-blocking compound mold head is provided with the light-blocking compound inlet channel, the light-blocking compound setting grooves and the avoidance groove, and the plurality of light-blocking compound mold heads are arranged spaced apart in a transverse direction of the light-blocking compound setting mold.

In an implementation, the light-blocking compound setting mold is further provided with a first connector and a first mounting body, a lower end of the first connector is connected to the plurality of light-blocking compound mold heads, and an upper end of the first connector is connected to a lower end of the first mounting body, and an upper end of the first mounting body is configured to be connected to the compound dripping machine.

In an implementation, the diffusion compound inlet channel is vertically arranged on the diffusion compound mold head, and the lower end of the diffusion compound inlet channel extends to a top wall of the diffusion compound setting groove.

In an implementation, a plurality of diffusion compound mold heads are provided, each diffusion compound mold head has the diffusion compound inlet channel and the diffusion compound setting groove, and the plurality of diffusion compound mold heads are arranged spaced apart in a transverse direction of the diffusion compound setting mold.

In an implementation, the diffusion compound setting mold is further provided with a second connector and a second mounting body, a lower end of the second connector is connected to the plurality of diffusion compound mold heads, and an upper end of the second connector is connected to a lower end of the second mounting body, and an upper end of the second mounting body is configured to be connected to the compound dripping machine.

In a third aspect, an embodiment of the present disclosure provides an LED light strip, including:
  a light panel;
  a light bead arranged on the light panel and being in electrical communication with the light panel; two light-blocking dam colloids, wherein the two light-blocking dam colloids are respectively arranged on a left side and a right side of the light bead, the two light-blocking dam colloids are simultaneously arranged on the light panel by means of compound dripping by a compound dripping machine, and the light-blocking dam colloids are configured to block light propagation over at least an angle when the light bead is lit up; and
  a diffusion colloid, wherein the diffusion colloid is arranged on the two light-blocking dam colloids by means of compound dripping by the compound dripping machine, the diffusion colloid connects the two light-blocking dam colloids together, the diffusion colloid covers the light bead, and the diffusion colloid is configured to scatter the light propagating to the outside over at least a certain angle when the light bead is lit up.

In an implementation, the light-blocking dam colloids are made of an opaque silica gel, and an inner surface of each of the light-blocking dam colloids close to the light bead is capable of reflecting light.

In an implementation, the diffusion colloid is made of a colored silica gel.

In an implementation, the colored silica gel includes the following colors or one or more selected from a group consisting of the following colors: milk white, black, blue, green, orange, yellow, red and purple.

In an implementation, an outer surface of the diffusion colloid away from the light bead has a convex form to facilitate the scattering of the light propagating to the outside when the light bead is lit up.

In an implementation, the light panel is a flexible circuit board.

The above summary is merely for the purpose of description, and is not intended to being limiting in any way. In addition to the above described aspects, implementations and features, further aspects, implementations and features of the present disclosure will become readily apparent with reference to the accompanying drawings and the following detailed description.

BRIEF DESCRIPTION OF DRAWINGS

In figures, unless otherwise specified, the same or similar components or elements are denoted by the same reference signs throughout a plurality of figures. These figures are not necessarily drawn to scale. It should be understood that these accompanying drawings depict only some implementations disclosed in the present disclosure and should not be construed as limiting the scope of the present disclosure.

FIG. 1 is a flowchart of a method for manufacturing an LED light strip according to the present disclosure;

LIST OF REFERENCE SIGNS

Figure 2:
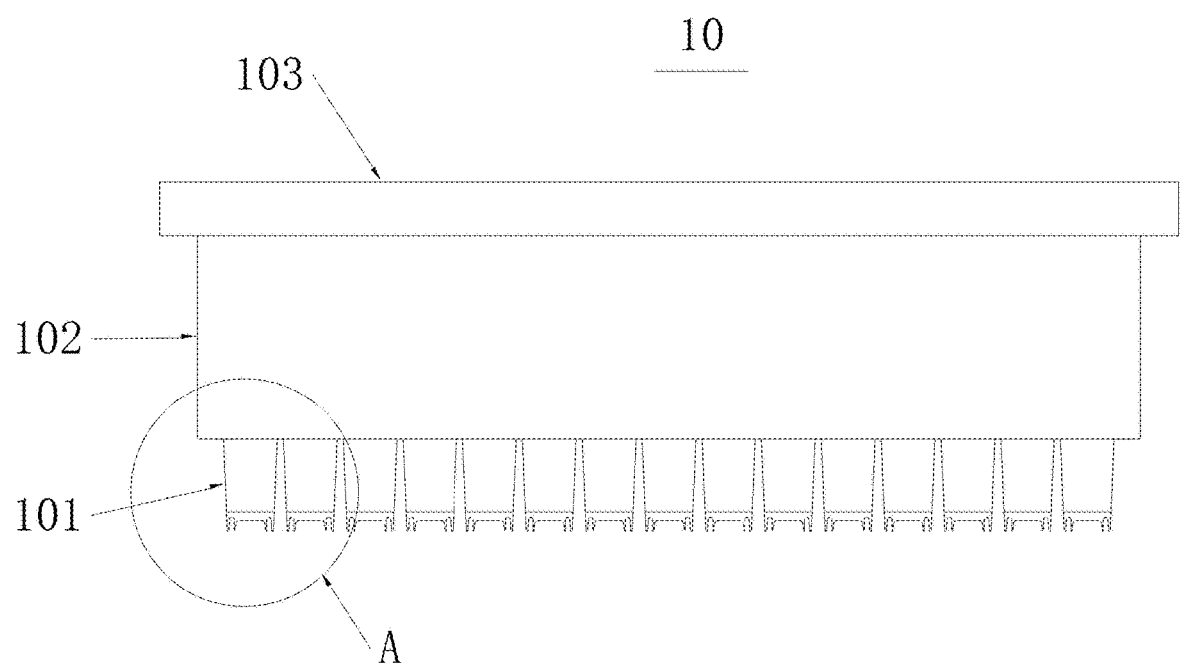
FIG. 2 is a front view of a light-blocking compound setting mold of a mold for manufacturing an LED light strip according to the present disclosure.
Figure 3:
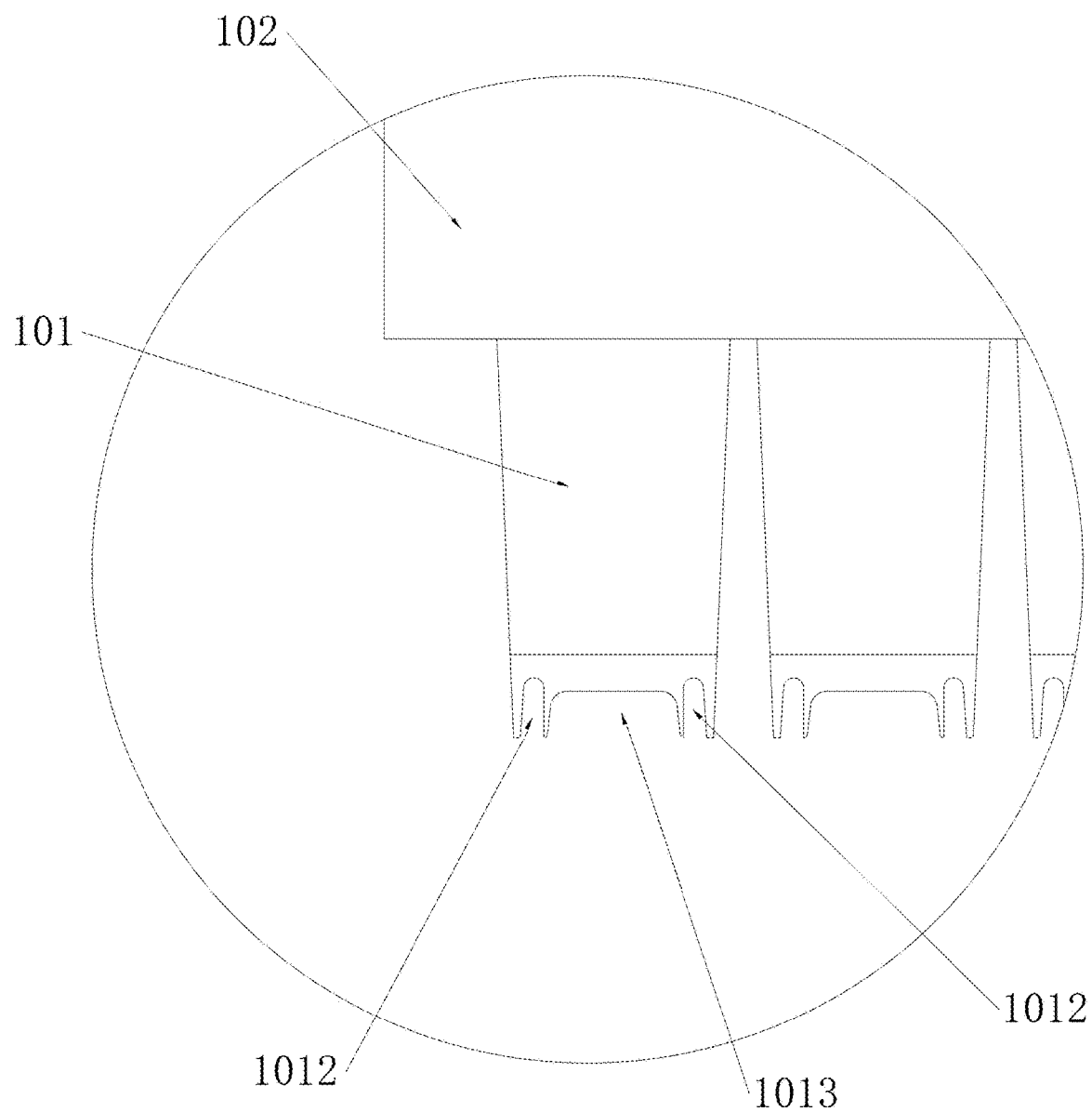
FIG. 3 is a partially enlarged view of part A of FIG. 2.
Figure 4:
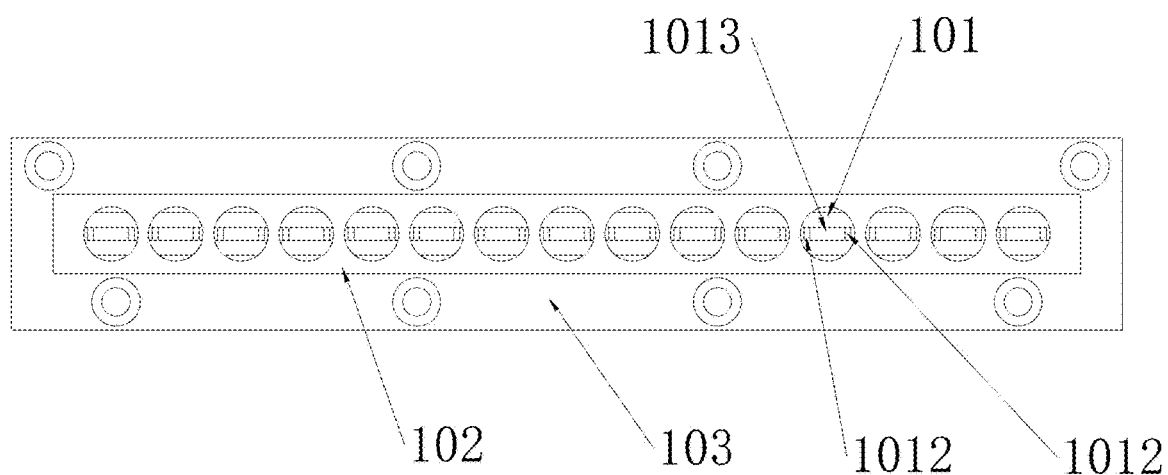
FIG. 4 is a bottom view of a light-blocking compound setting mold of a mold for manufacturing an LED light strip according to the present disclosure.
Figure 5:
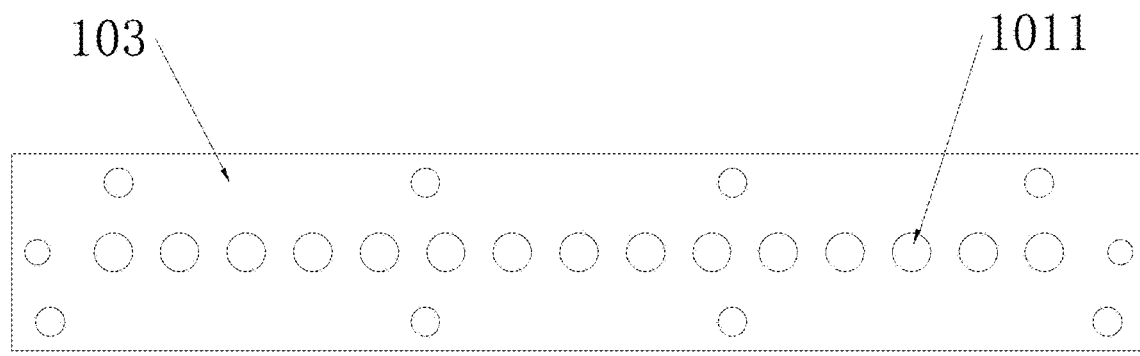
FIG. 5 is a top view of a light-blocking compound setting mold of a mold for manufacturing an LED light strip according to the present disclosure.
Figure 6:
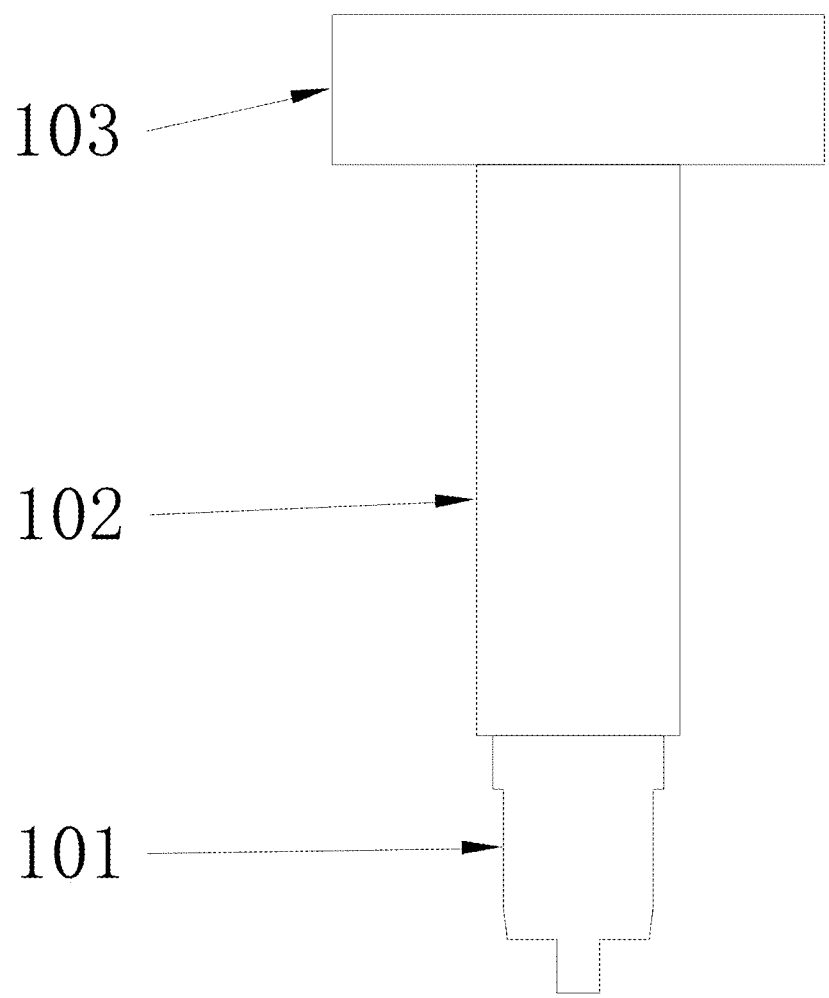
FIG. 6 is a right view of a light-blocking compound setting mold of a mold for manufacturing an LED light strip according to the present disclosure.
Figure 7:
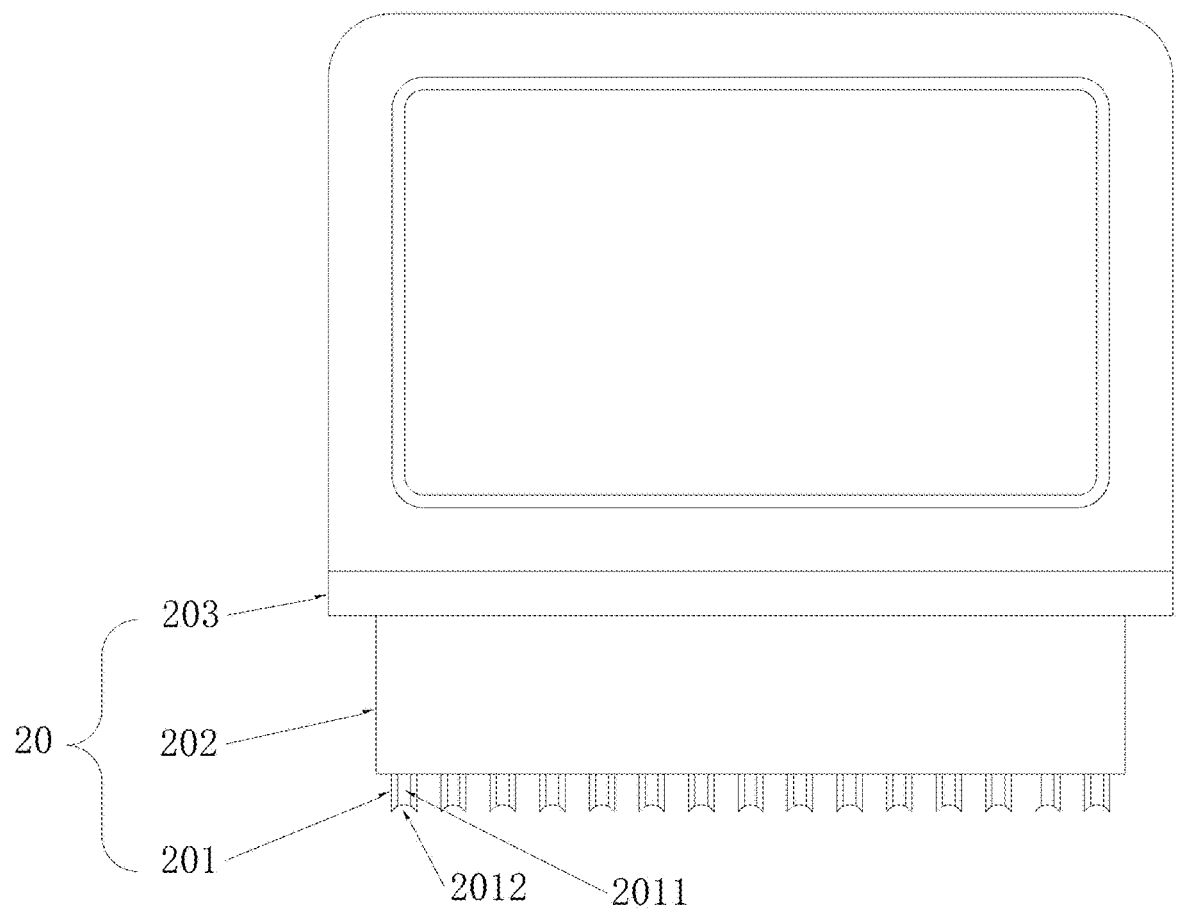
FIG. 7 is a front view of a diffusion compound setting mold of a mold for manufacturing an LED light strip according to the present disclosure.
Figure 8:
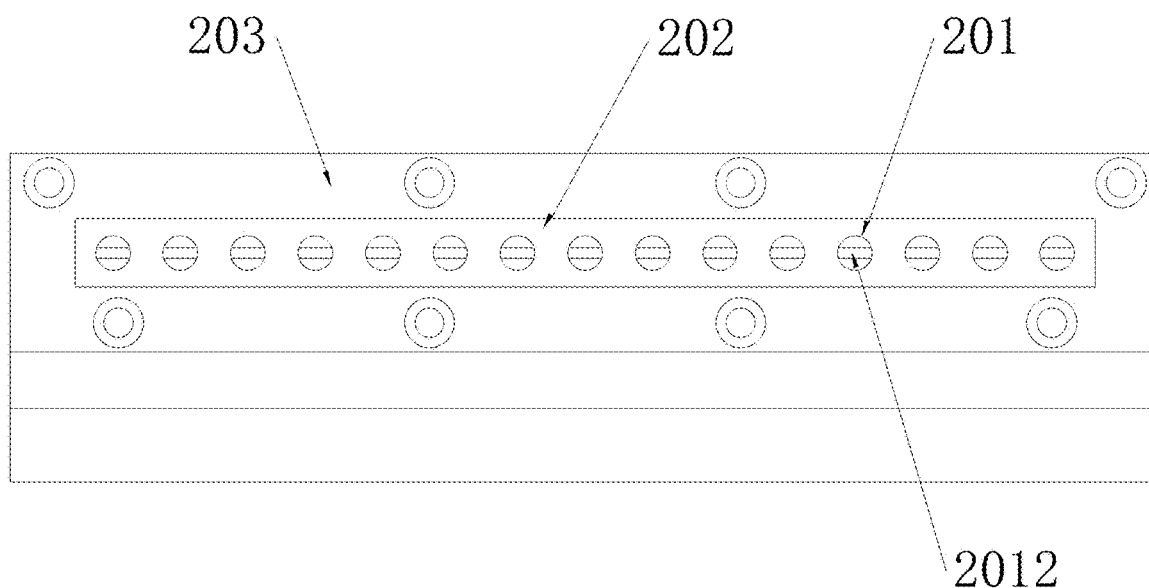
FIG. 8 is a bottom view of a diffusion compound setting mold of a mold for manufacturing an LED light strip according to the present disclosure.
Figure 9:
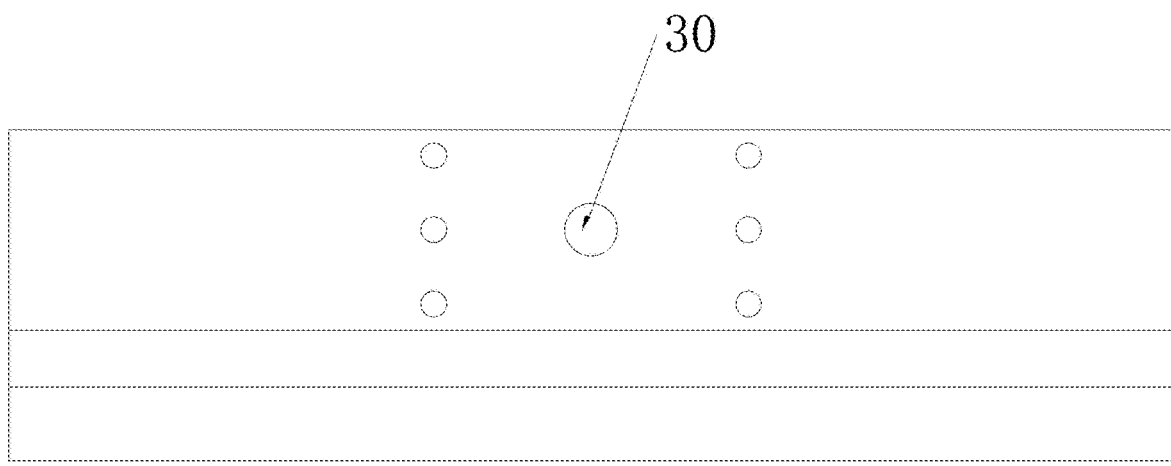
FIG. 9 is a top view of a diffusion compound setting mold of a mold for manufacturing an LED light strip according to the present disclosure.
Figure 10:
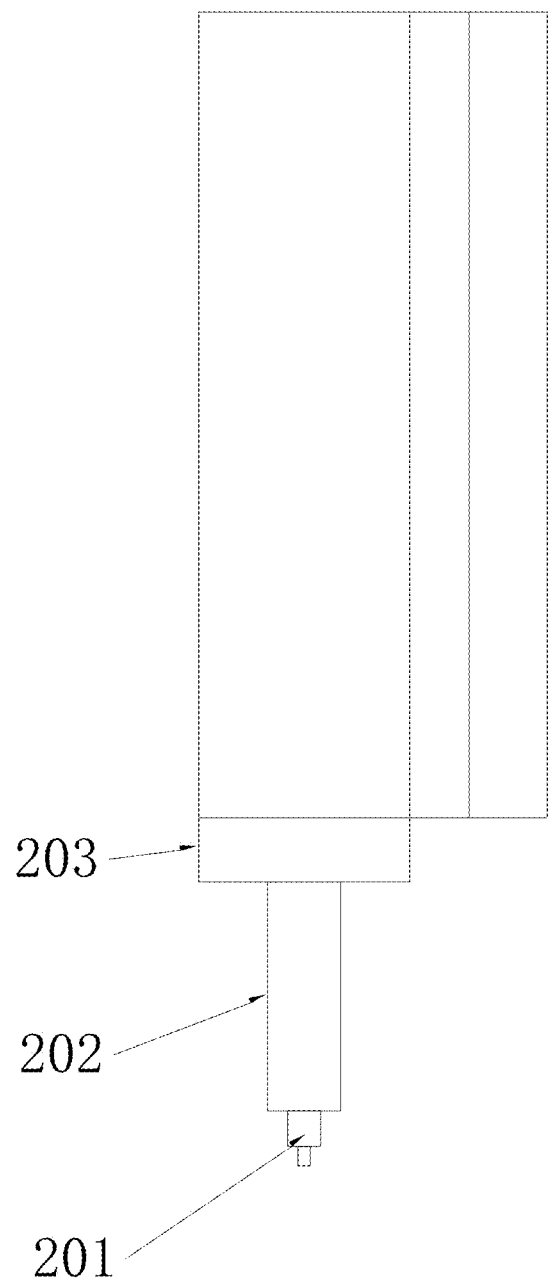
FIG. 10 is a right view of a diffusion compound setting mold of a mold for manufacturing an LED light strip according to the present disclosure.

10. Light-blocking compound setting mold; 101. Light-blocking compound mold head; 1011. Light-blocking compound inlet channel; 1012. Light-blocking compound setting groove; 1013. Avoidance groove; 102. First connector; 103. First mounting body; 20. Diffusion compound setting mold; 201. Diffusion compound mold head; 2011. Diffusion compound inlet channel; 2012. Diffusion compound setting groove; 202. Second connector; 203. Second mounting body; 30. Compound outlet; 1. Light bead; 2. Light panel; 3. Light-blocking dam colloid; 4. Diffusion colloid.

DETAILED DESCRIPTION OF EMBODIMENTS

Only some exemplary embodiments are briefly described below. As can be appreciated by those skilled in the art, modifications may be made to the described embodiments in various ways without departing from the spirit or scope of the present disclosure. Therefore, the accompanying drawings and the description are considered as exemplary in nature rather than limiting.

Referring to FIG. 1, a preferred embodiment of the present disclosure provides a method for manufacturing an LED light strip, including:

- a feeding step, during which a light panel 2 with a light bead 1 is placed on a compound dripping station of a compound dripping machine in such a way that a compound-dripped surface of the light panel 2 with the light bead 1 faces a bottom opening of each of light-blocking compound setting grooves 1012 of a light-blocking compound setting mold 10, and left and right light-blocking compound setting grooves 1012 of the light-blocking compound setting mold 10 are respectively disposed on a left side and a right side of the light bead 1;
- a light-blocking compound dripping step, during which a light-blocking compound is simultaneously dripped into the light-blocking compound setting grooves 1012 located on the left side and the right side of the light bead 1 by using the compound dripping machine, such that the light-blocking compound fills a cavity enclosed by the light-blocking compound setting grooves 1012 and the compound-dripped surface of the light panel 2, so as to form two light-blocking dam colloids 3 respectively disposed on the left side and the right side of the light bead 1 on the compound-dripped surface of the light panel 2; and
- a diffusion compound dripping step, during which after the light-blocking dam colloids 3 are cured such that the light-blocking dam colloids 3 face a bottom opening of a diffusion compound setting groove 2012 of a diffusion compound setting mold 20, a diffusion compound is dripped into the diffusion compound setting groove 2012 by using the compound dripping machine such that the diffusion compound fills a cavity enclosed by the diffusion compound setting groove 2012 and the compound-dripped surface of the light panel 2 to form a diffusion colloid 4 on the two light-blocking dam colloids 3.

In the method for manufacturing an LED light strip according to the present disclosure, since the two light-blocking dam colloids 3 respectively disposed on the left side and the right side of the light bead 1 are formed by means of simultaneous compound dripping by the compound dripping machine and setting with the aid of the light-blocking compound setting mold 10, the light-blocking compound dripping efficiency can be increased. Based on the fact that the compound dripping machine has a high compound dripping accuracy and the setting with the aid of the light-blocking compound setting mold 10 can effectively prevent compound leakage, the light-blocking compound dripping accuracy can also be improved. Therefore, the quality of the finished light-blocking dam colloids 3 is improved, and the light-blocking dam colloids 3 have an excellent light-blocking performance. In addition, since the diffusion colloid 4 is formed by means of compound dripping by the compound dripping machine and setting with the aid of the diffusion compound setting mold 20, based on the fact that the compound dripping machine has a high compound dripping accuracy and the setting with the aid of the diffusion compound setting mold 20 can effectively prevent compound leakage, the diffusion compound dripping accuracy can be improved. Therefore, the quality of the finished diffusion colloid 4 is improved, the diffusion colloid 4 has an excellent diffusion performance and allows the LED light strip to emit more uniform light, such that the manufactured LED light strip has a stable lighting quality, which contributes to improving the lighting efficiency of the LED light strip.

In an embodiment, the method for manufacturing an LED light strip further includes: a light-blocking compound stirring step, during which before the light-blocking compound is dripped, the light-blocking compound is vacuumized and stirred by using a vacuum agitator, so as to remove bubbles in the light-blocking compound, and at the same time, the light-blocking compound is fully and evenly stirred, such that the quality of the finished light-blocking dam colloids 3 is further improved, and the light-blocking dam colloids 3 have a stable light-blocking performance.

In an embodiment, the method for manufacturing an LED light strip further includes: a diffusion compound stirring step, during which before dripping of the diffusion compound, the diffusion compound is vacuumized and stirred by means of a vacuum agitator to remove bubbles in the diffusion compound, and at the same time, the diffusion compound is fully and evenly stirred, such that a diffusion agent in the diffusion compound precipitates slowly, and the diffusion agent is evenly distributed in the colloid, thereby further improving the quality of the finished diffusion colloid 4, enabling color purity of the light emitted by the LED light strip to reach 99%, further increasing the luminous efficiency, and emitting extremely uniform light.

Vacuumizing and stirring the diffusion compound are implemented by:

- loosening a fastener on a compound barrel of the compound dripping machine before removing a cover plate, pouring a mixture of the diffusion agent and a silica gel into the compound barrel, closing the cover plate and tightening the fastener;
- closing an air inlet valve and a compound outlet valve on the compound barrel;
- pressing a switch to activate the vacuum agitator to carry out the vacuumizing and stirring, turning on a lighting lamp during the vacuumizing to view, through an observation window on the compound barrel, that there are no visible bubbles in the diffusion compound, and stopping the vacuumizing (in 10-20 minutes);
- opening the compound outlet valve for discharging the compound, and delivering the diffusion compound to the diffusion compound setting groove 2012; and
- after the diffusion compound in the compound barrel is used up, first opening the air inlet valve, and after a pressure is released from the compound barrel, loosening the fastener on the cover plate and then removing the cover plate, and cleaning the compound barrel.

In an embodiment, in the light-blocking compound dripping step, a conveyor belt in the compound dripping machine is used to convey the light panel 2 in such a way that the light panel 2 passes through the compound dripping station, so as to drip the compound while the light panel 2 is conveyed. This enables the conveying of an ultra-long light panel 2 and the dripping of the light-blocking compound on the ultra-long light panel 2, significantly improves the manufacturing efficiency of the LED light strip, and saves manpower.

In an embodiment, in the light-blocking compound dripping step, an oven of the compound dripping machine is used to dry the light-blocking dam colloids 3 while the compound is dripped, so as to dry the compound while the compound is dripped, without the need to transfer, upon the completion of the compound dripping, the light panel 2 to a drying station outside the compound dripping machine for drying, resulting in fast curing and molding and significantly increasing the preparation efficiency of the light-blocking dam colloids 3. In addition, since the light-blocking dam colloids 3 located in the light-blocking compound setting grooves 1012 can be quickly cured, the liquid light-blocking compound can be effectively prevented from flowing, and thus the problem of an overflow of the compound can be avoided, which is beneficial to further improving the quality of the finished light-blocking dam colloids 3.

In an embodiment, in the diffusion compound dripping step, a conveyor belt in the compound dripping machine is used to convey the light panel 2 in such a way that the light panel 2 passes through the compound dripping station, so as to drip the compound while the light panel 2 is conveyed. This enables the conveying of an ultra-long light panel 2 and the dripping of the diffusion compound on the ultra-long light panel 2, significantly improves the manufacturing efficiency of the LED light strip, and saves manpower.

In an embodiment, in the diffusion compound dripping step, while compound dripping is performed, an oven of the compound dripping machine is used to dry the diffusion colloid 4, so as to dry the compound while the compound is dripped, without the need to transfer, upon the completion of the compound dripping, the light panel 2 to a drying station outside the compound dripping machine for drying, resulting in fast curing and molding and significantly increasing the preparation efficiency of the diffusion colloid 4. In addition, since the diffusion colloid 4 located in the diffusion compound setting groove 2012 can be quickly cured, the liquid diffusion compound can be effectively prevented from flowing, and thus the problem of an overflow of the compound can be avoided, which is beneficial to further improving the quality of the finished diffusion colloid 4.

An opaque silica gel material, such as a material with fire protection properties at levels UL94V0, V1 and V2 or level UL94HB and with a hardness of the Shore A30-90, may be selected for the light-blocking dam colloids 3 to meet different mechanical strength and deformation requirements. The flame retardant properties may be defined as follows. For a sample having a thickness of 3-13 mm, the burning velocity is less than 40 mm per minute; and for a samples having a thickness of less than 3 mm, the burning velocity is less than 70 mm per minute, such that the light-blocking dam colloids 3 have a better weather resistance and safety protection characteristics.

The diffusion colloid 4 is made of a light-transmissive silica gel material. For example, a transparent silica gel or a colored translucent silica gel having a refractive index of 83-98% may be selected to achieve a better light output.

In an embodiment, the diffusion colloid 4 is obtained by mixing a transparent silica gel with a colored additive to achieve different color combinations, and can achieve different color combinations in combination with the colors of the light-blocking dam colloids 3, such as a combination of a white opaque light-blocking dam colloid 3 and a transparent diffusion colloid 4, a combination of a white opaque light-blocking dam colloid 3 and a milk white translucent diffusion colloid 4, a combination of a black opaque light-blocking dam colloid 3, a milk white silica gel and a gray translucent diffusion colloid 4, or a combination of a brown opaque light-blocking dam colloid 3 and a brown translucent diffusion colloid 4, so as to present a wide variety of LED light strip combinations that can be used at home and in furniture, props, and other applications to be integrated with a corresponding space.

Referring to FIGS. 2 to 10, a mold for manufacturing an LED light strip according to a preferred embodiment of the present disclosure is shown, the mold including:

a light-blocking compound setting mold 10, wherein the light-blocking compound setting mold 10 is provided with a light-blocking compound mold head 101, the light-blocking compound mold head 101 has a light-blocking compound inlet channel 1011, light-blocking compound setting grooves 1012 and an avoidance groove 1013, an upper end of the light-blocking compound inlet channel 1011 is configured for communication with a compound outlet 30 of a compound dripping machine, a lower end of the light-blocking compound inlet channel 1011 extends to a wall of each of the light-blocking compound setting grooves 1012, the lower end of the light-blocking compound inlet channel 1011 is in communication with the light-blocking compound setting grooves 1012, the light-blocking compound setting grooves 1012 run through the light-blocking compound mold head 101 in a front-rear direction, the light-blocking compound setting grooves 1012 further run through a bottom wall of the light-blocking compound mold head 101, two light-blocking compound setting grooves 1012 are provided, the two light-blocking compound setting grooves 1012 are respectively arranged on a left side and a right side of the avoidance groove 1013, the avoidance groove 1013 runs through the light-blocking compound mold head 101 in a front-rear direction, the avoidance groove 1013 further runs through the bottom wall of the light-blocking compound mold head 101, and the avoidance groove 1013 is configured to be in clearance fit with a light bead 1 of a light panel 2, so as to avoid the light bead 1; and a diffusion compound setting mold 20, wherein the diffusion compound setting mold 20 is provided with a diffusion compound mold head 201, the diffusion compound mold head 201 has a diffusion compound inlet channel 2011 and a diffusion compound setting groove 2012, an upper end of the diffusion compound inlet channel 2011 is configured for communication with the compound outlet 30 of the compound dripping machine, a lower end of the diffusion compound inlet channel 2011 extends to a wall of the diffusion compound setting groove 2012, the lower end of the diffusion compound inlet channel 2011 is in communication with the diffusion compound setting groove 2012, the diffusion compound setting groove 2012 runs through the diffusion compound mold head 201 in a front-rear direction, and the diffusion compound setting groove 2012 further runs through a bottom wall of the diffusion compound mold head 201.

The mold for manufacturing an LED light strip according to the present disclosure includes the light-blocking compound setting mold 10 and the diffusion compound setting mold 20. The light-blocking compound setting mold 10 is provided with the light-blocking compound mold head 101, and the light-blocking compound mold head 101 has the light-blocking compound inlet channel 1011, the light-blocking compound setting grooves 1012 and the avoidance groove 1013. The light-blocking compound inlet channel 1011 can be in communication with the compound outlet 30 of the compound dripping machine and the light-blocking compound setting grooves 1012, such that the light-blocking compound output from the compound outlet 30 of the compound dripping machine can be delivered to the light-blocking compound setting grooves 1012 through the light-blocking compound inlet channel 1011 to fill the light-blocking compound setting grooves 1012, such that the light-blocking dam colloids 3 that matches with the light-blocking compound setting grooves 1012 in shape can be formed on the light panel 2. The light-blocking compound setting grooves 1012 aid in setting, which can effectively avoid the problem of compound leakage during compound dripping, ensure that the required light-blocking dam colloids 3 can be formed on the light panel 2 and thus improve the quality of the finished light-blocking dam colloids 3 to allow the light-blocking dam colloids 3 to have an excellent light-blocking performance. The avoidance groove 1013 can be in clearance fit with the light bead 1 to avoid the light bead 1. The diffusion compound setting mold 20 is provided with the diffusion compound mold head 201, and the diffusion compound mold head 201 has the diffusion compound inlet channel 2011 and the diffusion compound setting groove 2012. The diffusion compound inlet channel 2011 can be in communication with the compound outlet 30 of the compound dripping machine and the diffusion compound setting groove 2012, such that the diffusion compound output from the compound outlet 30 of the compound dripping machine can be delivered to the diffusion compound setting groove 2012 through the diffusion compound inlet channel 2011 to fill the diffusion compound setting groove 2012, such that the diffusion colloid 4 that matches with the diffusion compound setting groove 2012 in shape can be formed on the light panel 2. The diffusion compound setting groove 2012 aids in setting, which can effectively avoid the problem of compound leakage during compound dripping, ensure that the required diffusion colloid 4 can be formed on the light panel 2 and thus improve the quality of the finished diffusion colloid 4 to allow the diffusion colloid 4 to have an excellent diffusion performance and to allow the LED light strip to emit more uniform light, such that the manufactured LED light strip has a stable lighting quality, which contributes to improving the lighting efficiency of the LED light strip.

In an embodiment, the light-blocking compound inlet channel 1011 is vertically arranged on the light-blocking compound mold head 101, such that the light-blocking compound can be delivered into the light-blocking compound setting grooves 1012 along the light-blocking compound inlet channel 1011 under its own gravity without other driving devices, which can simplify the structure, thereby reducing the costs. The lower end of the light-blocking compound inlet channel 1011 extends to top walls of the light-blocking compound setting grooves 1012, such that the light-blocking compound is ejected, by means of the top walls of the light-blocking compound setting grooves 1012, onto the compound-dripped surface of the light panel 2 located below the light-blocking compound setting grooves, and the light-blocking compound is dripped more uniformly.

In an embodiment, a plurality of light-blocking compound mold heads 101 are provided, and each light-blocking compound mold head 101 is provided with the light-blocking compound inlet channel 1011, the light-blocking compound setting grooves 1012 and the avoidance groove 1013. The plurality of light-blocking compound mold heads 101 are arranged spaced apart in a transverse direction of the light-blocking compound setting mold 10. Since the plurality of light-blocking compound mold heads 101 are provided, and each light-blocking compound mold head 101 is provided with a light-blocking compound inlet channel 1011, a light-blocking compound setting grooves 1012 and an avoidance groove 1013, the light-blocking compound can be dripped on a plurality of light panels 2 at the same time by means of one-to-one correspondence between the light-blocking compound mold heads 101 and the light panels 2, thus significantly increasing the manufacturing efficiency of the LED light strip.

In an embodiment, the light-blocking compound setting mold 10 is further provided with a first connector 102 and a first mounting body 103. A lower end of the first connector 102 is connected to the plurality of light-blocking compound mold heads 101, and an upper end of the first connector 102 is connected to a lower end of the first mounting body 103. An upper end of the first mounting body 103 is configured to be connected to the compound dripping machine. The first connector 102 is provided to allow the plurality of light-blocking compound mold heads 101 to be connected as one piece and to enable an integrated arrangement of the plurality of light-blocking compound mold heads 101, and is connected to the compound dripping machine by means of the first mounting body 103, in order to facilitate the fixation of the light-blocking compound setting mold 10 to the compound dripping machine.

In an embodiment, the diffusion compound inlet channel 2011 is vertically arranged on the diffusion compound mold head 201, such that the diffusion compound can be delivered into the diffusion compound setting groove 2012 along the diffusion compound inlet channel 2011 under its own gravity without other driving devices, which can simplify the structure, thereby reducing the costs. The lower end of the diffusion compound inlet channel 2011 extends to a top wall of the diffusion compound setting groove 2012, such that the diffusion compound is ejected, by means of the top wall of the diffusion compound setting groove 2012, onto the compound-dripped surface of the light panel 2 located below the diffusion compound setting groove, and the diffusion compound is dripped more uniformly.

In an embodiment, a plurality of diffusion compound mold heads 201 are provided, each diffusion compound mold head 201 has the diffusion compound inlet channel 2011 and the diffusion compound setting groove 2012, and the plurality of diffusion compound mold heads 201 are arranged spaced apart in a transverse direction of the diffusion compound setting mold 20. Since the plurality of diffusion compound mold heads 201 are provided, and each diffusion compound mold head 201 is provided with the diffusion compound inlet channel 2011, the diffusion compound setting groove 2012 and the avoidance groove 1013, the diffusion compound can be dripped on a plurality of light panels 2 at the same time by means of one-to-one correspondence between the diffusion compound mold heads 201 and the light panels 2, thus significantly increasing the manufacturing efficiency of the LED light strip.

In an embodiment, the diffusion compound setting mold 20 is further provided with a second connector 202 and a second mounting body 203. A lower end of the second connector 202 is connected to the plurality of diffusion compound mold heads 201, and an upper end of the second connector 202 is connected to a lower end of the second mounting body 203. An upper end of the second mounting body 203 is configured to be connected to the compound dripping machine. The second connector 202 is provided to allow the plurality of diffusion compound mold heads 201 to be connected as one piece and to enable an integrated arrangement of the plurality of diffusion compound mold heads 201, and is connected to the compound dripping machine by means of the second mounting body 203, in order to facilitate the fixation of the diffusion compound setting mold 20 to the compound dripping machine.

Figure 11:
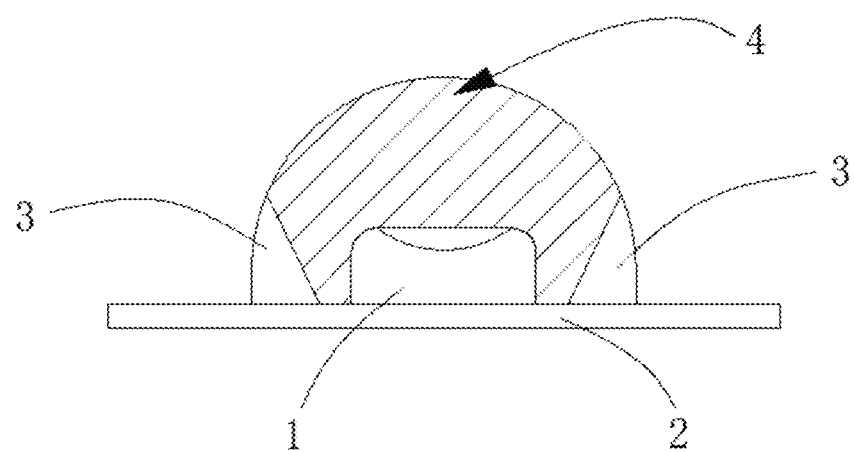
FIG. 11 is a schematic perspective structural diagram of an LED light strip according to the present disclosure.

Referring to FIG. 11, an LED light strip according to a preferred embodiment of the present disclosure is shown, the LED light strip including:

- a light panel 2;
- a light bead 1 arranged on the light panel 2 and being in electrical communication with the light panel 2;
- two light-blocking dam colloids 3, wherein the two light-blocking dam colloids 3 are respectively arranged on a left side and a right side of the light bead 1, the two light-blocking dam colloids 3 are simultaneously arranged on the light panel 2 by means of compound dripping in light-blocking compound setting grooves 1012 by a compound dripping machine, and the light-blocking dam colloids 3 are configured to block light propagation over at least an angle when the light bead 1 is lit up; and
- a diffusion colloid 4, wherein the diffusion colloid 4 is arranged on the two light-blocking dam colloids 3 by means of compound dripping in a diffusion compound setting groove 2012 by the compound dripping machine, the diffusion colloid 4 connects the two light-blocking dam colloids 3 together, the diffusion colloid 4 covers the light bead 1, and the diffusion colloid 4 is configured to scatter the light propagating to the outside over at least a certain angle when the light bead 1 is lit up.

In the LED light strip according to the present disclosure, since the two light-blocking dam colloids 3 respectively disposed on the left side and the right side of the light bead 1 are formed simultaneously by means of compound dripping in the light-blocking compound setting grooves 1012 by the compound dripping machine, the light-blocking compound dripping efficiency can be increased. Based on the fact that the compound dripping machine has a high compound dripping accuracy and the setting with the aid of the light-blocking compound setting grooves 1012 can effectively prevent compound leakage, the light-blocking compound dripping accuracy can be improved. Therefore, the quality of the finished light-blocking dam colloids 3 is improved, and the light-blocking dam colloids 3 have an excellent light-blocking performance. In addition, since the diffusion colloid 4 is formed by means of compound dripping in the diffusion compound setting groove 2012 by the compound dripping machine, based on the fact that the compound dripping machine has a high compound dripping accuracy and the setting with the aid of the diffusion compound setting groove 2012 can effectively prevent compound leakage, the diffusion compound dripping accuracy can be improved. Therefore, the quality of the finished diffusion colloid 4 is improved, the diffusion colloid 4 has an excellent diffusion performance and allows the LED light strip to emit more uniform light, such that the manufactured LED light strip has a stable lighting quality, which contributes to improving the lighting efficiency of the LED light strip.

In an embodiment, the light-blocking dam colloids 3 are made of an opaque silica gel, and an inner surface of each of the light-blocking dam colloids 3 close to the light bead 1 can reflect light. In this way, the light emitted by the light bead 1 can pass through the diffusion colloid 4 more intensively, such that the utilization rate of the light emitted by the light bead 1 is increased, and the LED light strip has a better light-emitting effect.

In other embodiments, the light-blocking dam colloids 3 may be made of a light-transmissive silica gel.

In other embodiments, part of the light-blocking dam colloid 3 may be made of an opaque silica gel, and the other part thereof may be made of a light-transmissive silica gel.

In an embodiment, the diffusion colloid 4 is made of a colored silica gel, such that the LED light strip can be implemented with integrated color and scattering, can be mounted and used in an extremely narrow and extremely short space (for example, with a minimum narrowness of 3 mm and a minimum shortness of 2.5 mm), emits more uniform light, improves luminous efficiency, and has a smaller thickness than that in a conventional process.

In an embodiment, the colored silica gel includes the following colors or one or more selected from a group consisting of the following colors: milk white, black, blue, green, orange, yellow, red and purple, to enable color matches with the environment in which the LED light strip is mounted. In this way, a user can choose a colored silica gel with an appropriate color according to actual needs, and thus the LED light strip can adapt to more application scenarios.

In an embodiment, an outer surface of the diffusion colloid 4 away from the light bead 1 has a convex form to facilitate the scattering of the light propagating to the outside when the light bead 1 is lit up. In this way, the light emitted by the light bead 1 can be more uniformly emitted from the diffusion colloid 4, such that the LED light strip has a better light-emitting effect.

In other embodiments, the outer surface of the diffusion colloid 4 away from the light bead 1 may be non-convex.

In an embodiment, the convex form is cambered, such that the uniformity of the light emitted by the light bead 1 after the light is emitted from the diffusion colloid 4 can be further improved, which further resulting in a better light-emitting effect of the LED light strip.

In other embodiments, the convex form may be flat, or the convex form may be irregular, or the convex form may have other suitable forms.

In some application scenarios, the LED light strip needs to be bent during mounting. Therefore, in an alternative embodiment, the light panel 2 is a flexible circuit board, such that the light panel 2 is flexible. When the LED light strip needs to be bent during mounting, the light panel 2 can be bent smoothly without being damaged, such that the LED light strip can be suitable for more application scenarios.

In other embodiments, the light panel 2 may be a rigid circuit board.

In the description of this specification, descriptions made with reference to the terms such as "an embodiment", "some embodiments", "example", "specific example", or "some examples" mean that specific features, structures, materials, or characteristics described with reference to the embodiment or example are included in at least one embodiment or example of the present disclosure. Moreover, the specific features, structures, materials or characteristics described can be combined in any one or more embodiments or examples in any suitable manner. In addition, without any contradiction, a person skilled in the art may bind and combine different embodiments or examples and features of the different embodiments or examples in the description.

In addition, the terms "first" and "second" are merely used for illustration, and may not be construed as indicating or implying relative importance or implicitly indicating the number of technical features indicated. Thus, the features defined with "first" and "second" may explicitly or implicitly include at least one of the features. In the description of the present disclosure, the term "plurality of" means two or more, unless specifically and specifically defined otherwise.

The above descriptions are merely specific implementations of the present disclosure, but are not intended to limit the scope of protection of the present disclosure. Any variation or replacement readily conceived by those skilled in the art within the technical scope disclosed in the present disclosure shall fall within the scope of protection of the present disclosure. Therefore, the scope of protection of the present disclosure shall be subject to the scope of protection of the claims.

The invention claimed is:

1. A method for manufacturing an LED light strip, comprising:
    a feeding step, during which a light panel with a light bead is placed on a compound dripping station of a compound dripping machine in such a way that a compound-dripped surface of the light panel with the light bead faces a bottom opening of each of light-blocking compound setting grooves of a light-blocking compound setting mold, and a left light-blocking compound setting groove and a right light-blocking compound setting groove of the light-blocking compound setting mold are respectively disposed on a left side and a right side of the light bead;
    a light-blocking compound dripping step, during which a light-blocking compound is simultaneously dripped into the light-blocking compound setting grooves located on the left side and the right side of the light bead by using the compound dripping machine, so as to form two light-blocking dam colloids respectively disposed on the left side and the right side of the light bead on the compound-dripped surface of the light panel; and
    a diffusion compound dripping step, during which after the light-blocking dam colloids are cured such that the light-blocking dam colloids face a bottom opening of a diffusion compound setting groove of a diffusion compound setting mold, a diffusion compound is dripped into the diffusion compound setting groove by using the compound dripping machine, so as to form a diffusion colloid on the two light-blocking dam colloids respectively disposed on the left side and the right side of the light bead.

2. The method for manufacturing an LED light strip according to claim 1, further comprising:
    a light-blocking compound stirring step, during which before the light-blocking compound is dripped, the light-blocking compound is vacuumized and stirred by using a vacuum agitator, so as to remove bubbles in the light-blocking compound.

3. The method for manufacturing an LED light strip according to claim 1, further comprising:
    a diffusion compound stirring step, during which before the diffusion compound is dripped, the diffusion compound is vacuumized and stirred by using a vacuum agitator, so as to remove bubbles in the diffusion compound.

4. The method for manufacturing an LED light strip according to claim 1, wherein in the light-blocking compound dripping step, a conveyor belt in the compound dripping machine is used to convey the light panel in such a way that the light panel passes through the compound dripping station, so as to drip the compound while the light panel is conveyed.

5. The method for manufacturing an LED light strip according to claim 1, wherein in the light-blocking compound dripping step, an oven of the compound dripping machine is used to dry the light-blocking dam colloids while the compound is dripped, so as to dry the compound while the compound is dripped.

6. The method for manufacturing an LED light strip according to claim 1, wherein in the diffusion compound dripping step, a conveyor belt in the compound dripping machine is used to convey the light panel in such a way that the light panel passes through the compound dripping station, so as to drip the compound while the light panel is conveyed.

7. The method for manufacturing an LED light strip according to claim 1, wherein in the diffusion compound dripping step, an oven of the compound dripping machine is used to dry the diffusion colloid while the compound is dripped, so as to dry the compound while the compound is dripped.

8. A mold for manufacturing an LED light strip, comprising:
    a light-blocking compound setting mold, wherein the light-blocking compound setting mold is provided with a light-blocking compound mold head, the light-blocking compound mold head has a light-blocking compound inlet channel, light-blocking compound setting grooves and an avoidance groove, an upper end of the light-blocking compound inlet channel is configured for communication with a compound outlet of a compound dripping machine, a lower end of the light-blocking compound inlet channel extends to a wall of each of the light-blocking compound setting grooves, the lower end of the light-blocking compound inlet channel is in communication with the light-blocking compound setting grooves, the light-blocking compound setting grooves run through the light-blocking compound mold head in a front-rear direction, the light-blocking compound setting grooves further run through a bottom wall of the light-blocking compound mold head, two light-blocking compound setting grooves are provided, the two light-blocking compound setting grooves are respectively arranged on a left side and a right side of the avoidance groove, the avoidance groove runs through the light-blocking compound mold head in a front-rear direction, the avoidance groove further runs through the bottom wall of the light-blocking compound mold head, and the avoidance groove is configured to be in clearance fit with a light bead of a light panel, so as to avoid the light bead; and
    a diffusion compound setting mold, wherein the diffusion compound setting mold is provided with a diffusion compound mold head, the diffusion compound mold head has a diffusion compound inlet channel and a diffusion compound setting groove, an upper end of the diffusion compound inlet channel is configured for communication with the compound outlet of the compound dripping machine, a lower end of the diffusion compound inlet channel extends to a wall of the diffusion compound setting groove, the lower end of the diffusion compound inlet channel is in communication with the diffusion compound setting groove, the diffusion compound setting groove runs through the diffusion compound mold head in a front-rear direction, and the diffusion compound setting groove further runs through a bottom wall of the diffusion compound mold head.

9. The mold for manufacturing an LED light strip according to claim 8, wherein the light-blocking compound inlet channel is vertically arranged on the light-blocking compound mold head, and the lower end of the light-blocking compound inlet channel extends to top walls of the light-blocking compound setting grooves.

10. The mold for manufacturing an LED light strip according to claim 8, wherein a plurality of light-blocking compound mold heads are provided, each light-blocking compound mold head is provided with the light-blocking compound inlet channel, the light-blocking compound setting grooves and the avoidance groove, and the plurality of light-blocking compound mold heads are arranged spaced apart in a transverse direction of the light-blocking compound setting mold.

11. The mold for manufacturing an LED light strip according to claim 10, wherein the light-blocking compound setting mold is further provided with a first connector and a first mounting body, a lower end of the first connector is connected to the plurality of light-blocking compound mold heads, an upper end of the first connector is connected to a lower end of the first mounting body, and an upper end of the first mounting body is configured to be connected to the compound dripping machine.

12. The mold for manufacturing an LED light strip according to claim 8, wherein the diffusion compound inlet channel is vertically arranged on the diffusion compound mold head, and the lower end of the diffusion compound inlet channel extends to a top wall of the diffusion compound setting groove.

13. The mold for manufacturing an LED light strip according to claim 8, wherein a plurality of diffusion compound mold heads are provided, each diffusion compound mold head has the diffusion compound inlet channel and the diffusion compound setting groove, and the plurality of diffusion compound mold heads are arranged spaced apart in a transverse direction of the diffusion compound setting mold.

14. The mold for manufacturing an LED light strip according to claim 13, wherein the diffusion compound setting mold is further provided with a second connector and a second mounting body, a lower end of the second connector is connected to the plurality of diffusion compound mold heads, and an upper end of the second connector is connected to a lower end of the second mounting body, and an upper end of the second mounting body is configured to be connected to the compound dripping machine.

* * * * *